United States Patent
Miyagi et al.

(12) 
(10) Patent No.: US 6,417,317 B1
(45) Date of Patent: Jul. 9, 2002

(54) NOVOLAK RESIN PRECURSOR, NOVOLAK RESIN AND POSITIVE PHOTORESIST COMPOSITION CONTAINING THE NOVOLAK RESIN

(75) Inventors: Ken Miyagi; Kousuke Doi; Ryuusaku Takahashi; Hidekatsu Kohara; Toshimasa Nakayama, all of Kanagawa (JP)

(73) Assignee: Togyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/459,606

(22) Filed: Dec. 13, 1999

Related U.S. Application Data

(62) Division of application No. 09/122,177, filed on Jul. 24, 1998, now Pat. No. 6,207,788.

(30) Foreign Application Priority Data

Jul. 25, 1997 (JP) .............................. 9-200325

(51) Int. Cl.[7] .......................... C08G 14/04; G03F 7/023
(52) U.S. Cl. ...................... 528/152; 528/153; 528/155; 430/165; 430/192; 430/193
(58) Field of Search ................. 430/165, 192, 430/193; 528/153, 155, 152

(56) References Cited

U.S. PATENT DOCUMENTS

| | | | |
|---|---|---|---|
| 2,006,043 A | | 6/1935 | Dykstra .......................... 260/4 |
| 4,876,324 A | | 10/1989 | Nakano et al. .............. 528/142 |
| 5,196,289 A | * | 3/1993 | Jeffries, III et al. ......... 430/192 |
| 5,302,688 A | * | 4/1994 | Jeffries, III et al. ......... 528/155 |
| 5,306,594 A | * | 4/1994 | Sarubbi et al. .............. 430/165 |
| 5,413,894 A | * | 5/1995 | Sizensky et al. ............. 430/165 |
| 5,494,785 A | * | 2/1996 | Sizensky et al. ............. 430/326 |
| 5,932,389 A | * | 8/1999 | Zampini ...................... 430/192 |

FOREIGN PATENT DOCUMENTS

| | | |
|---|---|---|
| DE | 1545300 | 2/1970 |
| EP | 0 477 691 A2 | 4/1992 |
| EP | 0 759 449 A2 | 2/1997 |
| EP | 0 769 485 A1 | 4/1997 |
| FR | 1221797 | 6/1960 |

OTHER PUBLICATIONS

Derwent Abstract of JP 59191710 (Oct. 30, 1984).
Derwent Abstract of JP 63260920 (Oct. 27, 1988).
Derwent Abstract of JP 63210923 (Sep. 1, 1988).
Derwent Abstract of JP 61012714 (Jan. 21, 1986).

* cited by examiner

Primary Examiner—John S. Chu
(74) Attorney, Agent, or Firm—Sughrue Mion, PLLC

(57) ABSTRACT

A novolak resin precursor is composed of bonded phenolic moieties, one of the hydrogen atoms in the o- or p-positions relative to the hydroxy group of each phenolic moiety is substituted with an alkyl or alkenyl group having 1 to 3 carbon atoms, and the other two hydrogen atoms are bonded through methylene bonds. The content of ortho-ortho bonding is 30 to 70% relative to the number of total methylene bonds and the weight average molecular weight of the precursor is 300 to 10,000. A novolak resin is obtained from this precursor, and a positive photoresist composition comprises this novolak resin. The invention provides a positive photoresist composition that comprises less binuclear compounds, suppresses scum formation, is excellent in terms of definition and coating performance and provides a resist pattern having satisfactory heat resistance.

1 Claim, No Drawings

NOVOLAK RESIN PRECURSOR, NOVOLAK RESIN AND POSITIVE PHOTORESIST COMPOSITION CONTAINING THE NOVOLAK RESIN

This is a divisional of application Ser. No. 09/122,177 filed Jul. 24, 1998, now U.S. Pat. No. 6,207,788 the disclosure of which is incorporated herein by reference.

BACKGROUND OF THE INVENTION

1. Field of the Invention

The present invention relates to novolak resin precursors for the preparation of novel novolak resins which are suitable as a resin ingredient of a positive photoresist composition, novolak resins, and method of manufacturing these precursors and resins. The invention also relates to positive photoresist compositions containing the novolak resin.

2. Description of the Related Art

Positive photoresist compositions composed of an alkali-soluble novolak resin and a quinonediazide group-containing compound (photosensitizer) are used in practice as materials having high definition, sensitivity and etching resistance. In particular, those composed of an alkali-soluble novolak resin having moieties or units derived from m-cresol, p-cresol and 2,5-xylenol are known to suppress the formation of scum (residue after development) and to have satisfactory definition, sensitivity and other properties (Japanese Patent Laid-Open Nos. 6-202321 and 6-348007).

In such alkali-soluble novolak resins, the content of p-cresol unit affects definition and sensitivity. To be more specific, a large content of p-cresol unit improves definition and deteriorates sensitivity. Conversely, a small content enhances sensitivity and deteriorates definition. To obtain both satisfactory definition and sensitivity concomitantly, the use of a p-cresol-rich novolak resin having a low molecular weight (weight average molecular weight (Mw) of 500 to 5,000) has been investigated. This resin is, however, still insufficient in terms of the coating performance of a resultant resist composition relative to a substrate or the heat resistance of an obtained resist pattern.

On the other hand, it has been reported that the use of high ortho-ortho bonded novolak resins containing a large quantity of ortho-ortho bonding in positive photoresist compositions enhances definition (Japanese Patent laid-Open Nos. 59-162542, 60-159846, 4-202312, 6-345837 and 7-110576, SPIE, Vol. 631, pp. 76–82, 1986). These conventional high ortho-ortho bonded novolak resins are obtained synthetically from trifunctional phenolic compounds as raw materials, and their ortho-ortho (o—o) bonding is formed mainly between trifunctional phenolic moieties, as shown by the following formula. The term "trifunctional phenolic compound" used herein means a phenolic compound in which all of o- and p-positions relative to the hydroxy group of the compound are hydrogen atoms, and includes, for example, phenol and m-cresol.

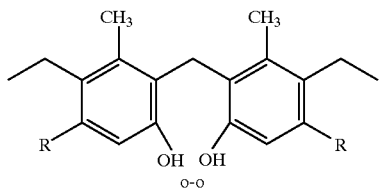

o-o

As method of manufacturing the high ortho-ortho bonded novolak resins, these publications disclose (1) the synthetic process of reacting a trifunctional compound with an aldehyde using a divalent organic metal catalyst at a pH of 4 to 7; (2) the synthetic process of reacting a trifunctional phenolic compound with an aldehyde source in the presence of a nonmetallic inorganic or organic acid as a catalyst; and (3) the synthetic process comprising the steps of reacting a trifunctional phenolic compound with an aldehyde source at a temperature of from 100 to 200° C. and at 2 to 15 atmospheres in the absence of a catalyst to thereby give an oligomer having a weight average molecular weight of 500 to 2,000; adding a mono-, di- or trifunctional phenolic compound and another aldehyde source to the oligomer, reacting the resultant mixture at a temperature of from 80 to 150° C. to thereby obtain a high ortho-ortho bonded novolak resin containing 50 to 70% of ortho-ortho bonding and having a weight average molecular weight of 3,000 to 40,000.

The above-mentioned processes (1) and (2) cannot give high ortho-ortho bonded novolak reins having sufficiently high molecular weights, whereas the process (3) is unsuitable for mass production because of its special synthetic conditions. In addition, each of these novolak resins contains large quantities of binuclear compounds as by-products, which seem to be attributable to p-cresol having low reactivity, and the binuclear compounds volatilize in the step of drying a photoresist coating so as to stain the oven. Binuclear compounds can be removed by steam distillation, fractional precipitation or other techniques (Japanese Patent Laid-Open No. 7-110576), but such purification treatments are expensive, and complete removal of the compounds is still difficult.

In addition, all of the high ortho-ortho bonded novolak resins synthetically obtained by the aforementioned processes (1) to (3) are m-cresol/p-cresol novolak resins composed of trifunctional phenolic moieties (principally, m-cresol), and ortho-ortho bonding between trifunctional phenolic moieties, and resist compositions prepared by using these resins are disadvantageous due to their formation of scum.

It is, therefore, a principle object of the present invention to provide a novel novolak resin for a positive photoresist composition which contains less binuclear compounds, suppresses scum formation, has satisfactory definition and coating performance, and can give a resist pattern having excellent heat resistance; a precursor for the novolak resin; methods of manufacturing the resin and precursor; and a positive photoresist composition comprising the aforementioned novolak resin.

SUMMARY OF THE INVENTION

Under the above-described circumstances, the present inventors earnestly conducted several investigations, and found that the use of, in a positive photoresist composition, a novolak resin obtained from a novolak resin precursor comprising a large content of difunctional phenolic moieties bonded through ortho-ortho methylene bonding can solve all of the problems of the conventional technology. The present invention has been completed based upon the above findings. Incidentally, the term "difunctional phenolic compound (moiety)" used herein means a phenolic compound (moiety) in which one of the hydrogen atoms in the o- and p-positions relative to the hydroxy group is substituted with a group other than a hydrogen atom, such as an alkyl group, an alkenyl group or others, and includes, for instance, p-cresol and 2,5-xylenol.

To be more specific, the present invention provides, in one aspect, a novolak resin precursor being composed of bonded phenolic moieties wherein each of the phenolic moieties one of the hydrogen atoms in the o- or p-positions, relative to the hydroxy group is substituted with an alkyl group or alkenyl group each having from 1 to 3 carbon atoms and the other two hydrogen atoms are bonded via a methylene bond; wherein the precursor comprises, relative to the number of total methylene bonds, 30 to 70% of ortho-ortho bonding, i.e., methylene bonds connecting two phenolic compounds in the o-position relative to the hydroxy groups of both phenolic compounds, and has a weight average molecular weight ranging from 300 to 10,000.

In another aspect, the present invention provides a novolak resin precursor having a weight average molecular weight of 300 to 10,000 obtained by reacting at least one compound shown by the following formula (I):

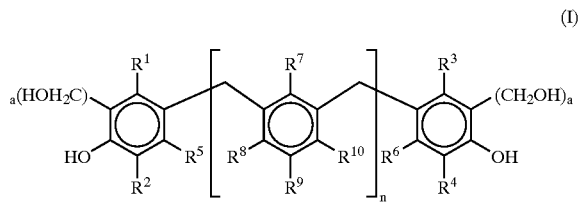

(I)

wherein each of $R^1$ and $R^3$ may be independently H, an alkyl group or alkenyl group each having from 1 to 3 carbon atoms, each of $R^2$ and $R^4$ may be independently an alkyl group or alkenyl group each having from 1 to 3 carbon atoms, each of $R^5$ and $R^6$ may be independently H, an alkyl group or alkenyl group each having from 1 to 3 carbon atoms, each of $R^7$, $R^8$, $R^9$ and $R^{10}$ is respectively H, OH, an alkyl group or alkenyl group each having from 1 to 3 carbon atoms, provided that when any one of $R^7$, $R^8$ or $R^{10}$ is OH, $R^9$ is not H, and when $R^9$ is OH, none of $R^7$, $R^8$ or $R^{10}$ is H; n denotes an integer from 0 to 3; and the number "a" denotes 0 or 1; with at least one compound shown by the following formula (II):

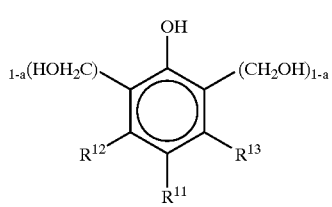

(II)

wherein $R^{11}$ is an alkyl or alkenyl group each having from 1 to 3 carbon atoms, each of $R^{12}$ and $R^{13}$ may be independently H, an alkyl group or alkenyl group each having from 1 to 3 carbon atoms, and the number "a" denotes 0 or 1.

The invention relates to, in a further aspect, the novolak resin precursor wherein the compound shown by the formula (I) is bis(2,5-dimethyl-4-hydroxyphenyl)methane and the compound shown by the formula (II) is 2,6-dimethylol-4-methylphenol.

In still another aspect, the present invention provides a novolak resin obtained by reacting the aforementioned novolak resin precursor with a trifunctional phenolic compound.

The present invention is directed to, in a yet further aspect, a novolak resin comprising at least m-cresol, p-cresol and 2,5-xylenol as constitutive units, wherein the content of p-cresol unit in the resin is 1 to 20% by mole, and a ratio of the integral ranging from 24.8 to 32.5 ppm relative to the integral ranging from 23.5 to 39.0 ppm, in $^{13}$C-NMR measurement, is 40 to 80%.

In an additional aspect, the present invention provides a process for producing a novolak resin precursor comprising the step of condensing the compound of the formula (I) with the compound of the formula (II) to give a novolak resin precursor having a weight average molecular weight of 300 to 10,000.

The present invention still further provides a process for producing a novolak resin comprising the step of condensing the aforementioned novolak resin precursor and a trifunctional phenolic compound in the presence of an aldehyde or a ketone.

Finally, the present invention relates to a positive photoresist composition comprising:

(A) the above-mentioned novolak resin, and
(B) a photosensitizer.

DETAILED DESCRIPTION OF THE INVENTION

The present invention will now be described below in further detail.

The present invention is characterized by obtaining the above-specified novolak resin precursor, preparing a novolak resin from this precursor, and using the obtained novolak resin as an alkali-soluble resin in a positive photoresist composition.

First, the novolak resin precursor is described below.

The novolak resin precursor of the present invention is a compound composed of bonded difunctional phenolic moieties bonded through methylene bonds, the methylene bonds between the difunctional compounds comprises 30 to 70% of the ortho-ortho bonding (o—o bonding) based upon the number of total methylene bonds in the compound, and has a weight average molecular weight of 300 to 10,000. As described, the novolak resin precursor of the present invention comprises the specific content of ortho-ortho bonding between difunctional phenolic compounds, and this characteristic completely distinguishes the novolak resin of the invention from conventional novolak resins having ortho-ortho bonding between trifunctional phenolic compounds. The use of ortho-ortho bonding between difunctional phenolic compounds can achieve high sensitivity and excellent definition without sacrificing coating performance and heat resistance.

In the novolak resin precursor of the present invention, a content of ortho-ortho bonding between difunctional phenolic moieties less than 30% reduces definition and decreases the film residual rate, whereas a content of more than 70% reduces sensitivity. A precursor having a weight average molecular weight of less than 300 is disadvantageous in that it has inferior definition and a decreased film residual rate, whereas, a weight average molecular weight of more than 10,000 reduces reactivity with a trifunctional phenolic compound and lessens the coating performance of the resultant novolak resin and the heat resistance of the resist pattern.

The method of manufacturing the novolak resin precursor of the present invention can be freely chosen, but the process of reacting the compounds of the formula (I) and (II) is advantageously employed for controlling the reaction conditions and minimizing the manufacturing cost.

Of the compounds shown by the formula (I), bis(2,5-dimethyl-4-hydroxyphenyl)methane (hereinafter referred to as "Bis2,5Xy") is practically preferred. The compound of the formula (I) will now be described taking Bis2,5Xy as an illustrative example.

By way of illustration, Bis2,5Xy can be obtained synthetically by reacting 2,5-xylenol with formaldehyde in the presence of an alkali catalyst. To be more specific, Bis2,5Xy can be obtained in the following manner: to water 2,5-xylenol and the alkali catalyst are added, and a formaldehyde aqueous solution is added dropwise to the resultant mixture over 1 to 5 hours while being heated to a temperature of about 70 to 75° C.; after completing the addition, the mixture is stirred for 1 to 5 hours while keeping it at the aforementioned temperature; the resultant mixture is then cooled to about 50° C., an acid is added, and stirred for 5 to 60 minutes to thereby neutralize the reaction mixture. An organic solvent such as butyl acetate is then added to the reaction mixture and the mixtures is stirred well; the organic solvent layer is then extracted, and the organic solvent is removed by distillation to thereby obtain crystals of Bis2,5Xy. Formaldehyde should preferably be added in a ratio of 0.1 to 1.0 mole relative to 1 mole of 2,5-xylenol. The use of formaldehyde in an amount less than this range deteriorates yield, and in contrast, an excess amount of formaldehyde disadvantageously gives polynuclear compounds.

Bis2,5Xy can also be bis(2,5-dimethyl-3-methylol-4-hydroxyphenyl)methane, a methylol-adduct. Upon synthesizing this compound, the reacting ratio of formaldehyde should preferably fall in the range of 1.1 to 1.5 moles relative to 1 mole of 2,5-xylenol.

The alkali catalyst used herein is not limited and can be chosen from inorganic or organic alkali catalysts generally used in preparation of resols. To conduct the reaction more efficiently and with enhanced reactivity, strongly basic alkali catalysts are suitable, among which sodium hydroxide, potassium hydroxide and other inorganic alkalis are particularly preferred. The amount of alkali catalyst should preferably fall in the range of 0.05 to 2.0 moles, particularly 0.1 to 0.5 mole relative to 1 mole of 2,5-xylenol.

Bis2,5Xy can be synthetically obtained in the above mentioned manner. Its presence and structure, i.e., para-para bonding, can be confirmed by gel permeation chromatography (GPC) and $^{13}$C-NMR, respectively. The crude yield of Bis2,5Xy is about 70 to 80%.

The Bis2,5Xy obtained in the aforementioned production embodiment may be subjected as such to the preparation of the novolak resin precursor, but a product from which impurities have been removed by recrystallization can preferably be subjected to the following procedure for easy control of the amount of ortho-ortho bonding in the novolak resin precursor. Recrystallization can be carried out with the use of toluene, heptane or other solvents, or mixtures of any of these solvents with butyl acetate or the like.

Next, as the compound shown by the formula (II), 2,6-dimethylol-4-methylphenol (hereinafter referred to as "2,6dMPC") is preferred. Accordingly, an example of synthesizing a high ortho-ortho bonded novolak resin precursor by reacting Bis2,5Xy with 2,6dMPC will now be described below.

Such a novolak resin precursor can be obtained by reacting Bis2,5Xy with 2,6dMPC in the presence of an acid catalyst. This reaction gives an ortho-ortho bonding-rich, high ortho-ortho bonded novolak resin precursor shown by the following formula:

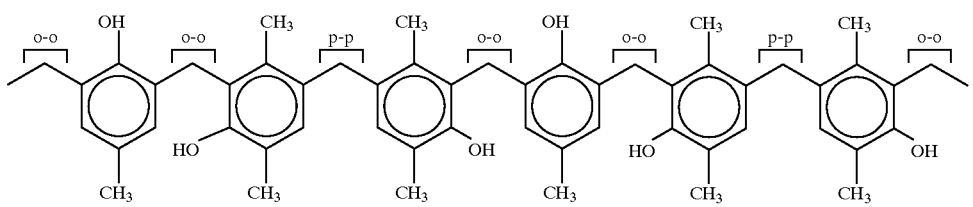

As is apparent from the above formula, the novolak resin precursor, as an embodiment of the present invention, constitutes a compound composed of plural difunctional phenolic moieties bonded through methylene bonds and contains a large quantity of ortho-ortho bonding. The symbols illustrated above the methylene bonds of aforementioned formula represent their bonding mode, and "o—o" and "p—p" respectively represent ortho-ortho bonding and para-para bonding relative to the hydroxy groups of phenolic moieties. These symbols have the same meanings in the formula below.

A preparation embodiment of the novolak resin precursor will be illustrated below in further detail.

First, 2,6dMPC is dissolved in an organic solvent to prepare a 2 to 10% by weight solution (Solution A). In a similar manner Bis2,5Xy is dissolved in an organic solvent to give a 20 to 60% by weight solution (Solution B). To Solution B an acid catalyst is added and the resultant mixture is then heated to a temperature of about 90 to 100° C. while stirring to enhance the reaction rate. Solution A is then slowly added dropwise to the mixture over about 1 hour, and after completing the addition, the resultant mixture is stirred for 3 to 5 hours while maintaining the aforementioned temperature to thereby give a solution of a high ortho-ortho bonded novolak resin precursor.

Any solvent in which both 2,6dMPC and Bis2,5Xy are soluble can be employed as a reaction solvent. Such solvents include, for example, methanol, ethanol, propanol, butanol, ethylene glycol, propylene glycol and other alcohols; diethylene glycol dimethyl ether, propylene glycol monopropyl ether, 1,2-dimethoxyethane, 1,2-diethoxyethane and other ethers; tetrahydrofuran, dioxane and other cyclic ethers; acetone, methyl ethyl ketone, methyl isobutyl ketone and other ketones; γ-butyrolactone and other cyclic esters and so on. It has been confirmed that of these solvents, the reaction rate in alcohols, ethers, in particular methanol, propylene glycol monopropyl ether and the like is slow. Conversely, it has also been confirmed that the reaction rate in γ-butyrolactone and other cyclic esters is rapid, whereas the solubility of 2,6dMPC and Bis2,5Xy in these solvents are somewhat low. Therefore, a solvent system which provides high solubility, particularly high solubility at room temperature, does not adversely affect the activity of the acid catalyst and has a boiling point which is not very low is suitable. As an example of this solvent system, a mixture of methanol and γ-butyrolactone can be mentioned.

The reacting ratio of 2,6dMPC should preferably fall in the range from 0.1 to 1.0 mole and in particular from 0.2 to 0.7 mole relative to 1 mole of Bis2,5Xy. The use of 2,6dMPC less than this range fails to give a novolak resin precursor having a high molecular weight, provides a large quantity of unreacted residual Bis2,5Xy and thereby deteriorates yield, and lessens the ratio of ortho-ortho bonding; whereas an excess amount gives a precursor having an excessively high molecular weight, deteriorates the reactivity of the obtained novolak resin precursor with a trifunctional phenolic compound (e.g., m-cresol) which is used in the preparation of a novolak resin, and hence a resin having a high molecular weight cannot be obtained.

As examples of the acid catalyst, hydrochloric acid, sulfuric acid, phosphoric acid and other inorganic acids, oxalic acid, acetic acid, p-toluenesulfonic acid and other organic acids, among which p-toluenesulfonic acid is particularly preferred may be mentioned.

In the method of manufacturing the novolak resin precursor mentioned above, in addition to ortho-ortho bonding, para-para bonding forms, but ortho-para bonding does not. This also distinguishes the present invention from conventional technology.

5Xy and 2,6dMPC, a binuclear compound has not been observed to form.

The content of ortho-ortho bonding formed between Bis2,5Xy and 2,6dMPC can be determined by the ratio of the methylene bond peak appearing in the range of from 24.8 to 32.5 ppm (ortho-ortho bonded methylene groups) relative to the peak of the methylene bond appearing in the range of from 23.5 to 39.0 ppm (including ortho-ortho bonded and para-para bonded methylene groups) in $^{13}$C-NMR measurement. The content of ortho-ortho bonding and the weight average molecular weight of the novolak resin precursor can be controlled by adjusting the reaction ratio of 2,6dMPC relative to Bis2,5Xy, as described above, as well as by addition of a mono-, di- or trifunctional phenolic compound. Incidentally, since p-cresol has a low reactivity and its use tends to form binuclear compounds, the amount of p-cresol should preferably be minimized. As a mono-, di- or trifunctional phenolic compound, the addition of 2,5-xylenol, for instance, can provide a novolak resin precursor containing less ortho-ortho bonding and having a low weight average molecular weight.

The content of ortho-ortho bonding and the weight average molecular weight of the novolak resin precursor can also be controlled by substituting a part or all of the Bis2,5Xy with compounds represented by the following formula:

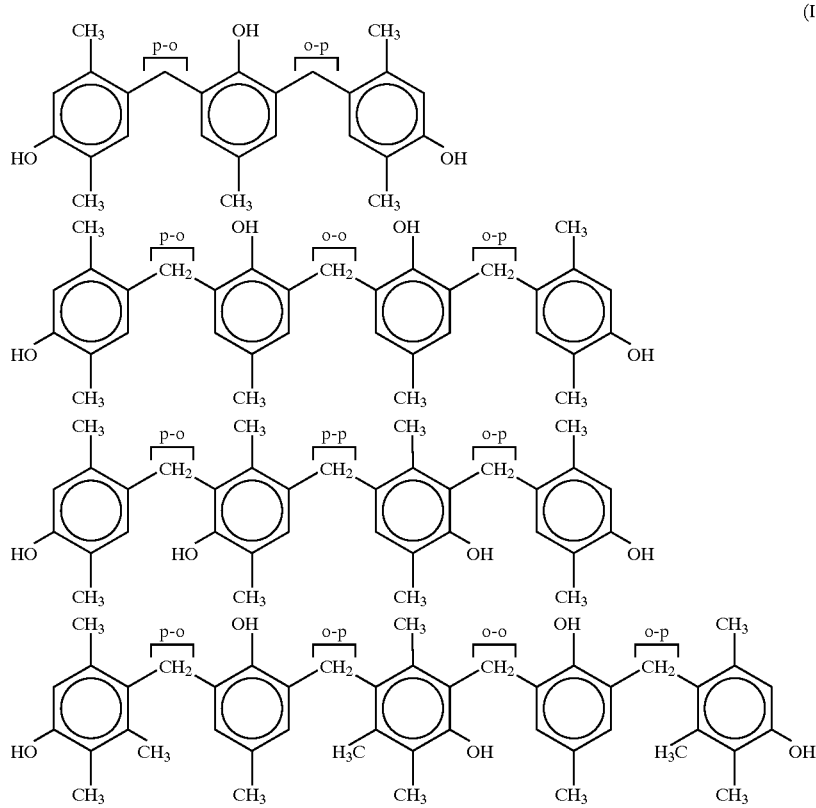

(IV)

In this process, since p-cresol is not used but 2,6dMPC is employed, binuclear compounds derived from p-cresol do not form.

Almost no 2,6dMPC is reacted with another one, and in the preparation of the novolak resin precursor using Bis2, The compounds shown above are all known and can be synthetically obtained by, for example, the method described in Japanese Patent Laid-Open No. 6-167805. Since the aforementioned compounds are less reactive than Bis2,5Xy, the weight average molecular weight of the precursor can be decreased by increasing the amount of any of these compounds. The content of ortho-ortho bonding can also be controlled by selecting an appropriate structure in the above compounds.

According to the manufacturing method just mentioned above, a novolak resin precursor having a content of ortho-ortho bonding of 30 to 70%, preferably 40 to 65%, and a weight average molecular weight ranging from 300 to 10,000, preferably from 500 to 3,000, can be obtained.

The above reaction proceeds quantitatively with almost no by-products so that the resultant product precursor can be subjected as such to further synthesis without purification. It is rather preferred to use the product as such in order to prevent a fall in the yield due to repeated purification processes.

The novolak resin precursor thus obtained is then reacted with a trifunctional phenolic compound to thereby give a high ortho-ortho bonded novolak resin.

As the trifunctional phenolic compound, m-cresol can advantageously be employed. Accordingly, an illustrative example of the method of manufacturing a high ortho-ortho bonded novolak resin with the use of m-cresol will be described below.

The novolak resin of the present invention can be obtained by reacting the novolak resin precursor with m-cresol and formaldehyde in the presence of an acid catalyst.

To be more specific, m-cresol is added to the aforementioned novolak resin precursor solution, and the resultant mixture is heated to a temperature from 90 to 100° C. Formaldehyde aqueous solution is then added dropwise to the mixture over 20 to 30 minutes, the mixture is stirred and reacted for 5 to 10 hours while maintaining the temperature for conducting a reaction. After completion of the reaction, the reaction mixture is added with water and allowed to stand, and hence a water layer and a reaction solvent layer are separated into an upper layer and a lower layer respectively. Since unreacted compounds, low molecular weight compounds, the catalyst or the like are contained in the upper layer and the novolak resin is contained in the lower layer, the novolak resin can be obtained by extracting the lower layer. A reaction catalyst and a reaction solvent used herein can be chosen from those mentioned in the reaction of the novolak resin precursor.

The reaction ratio of formaldehyde may be determined depending on the weight average molecular weight of the novolak resin precursor and the amount of m-cresol added, and should preferably fall in the range of from 0.1 to 1.5 moles and more preferably of from 0.3 to 0.8 mole relative to 1 mole of m-cresol. The use of formaldehyde below this range fails to provide a novolak resin having a high weight average molecular weight, whereas an excess amount invites a resin having an excessively high weight average molecular weight and therefore it is unsuitable for the preparation of a photoresist composition. Aldehydes or ketones other than formaldehyde used in the synthesis of conventional novolak resins can also be employed.

In this synthesis of novolak resin, ortho-para bonding forms in addition to ortho-ortho bonding and para-para bonding.

The content of ortho-ortho bonding in the novolak resin can be determined by the ratio of the peak of methylene bonds appearing in the range from 24.8 to 32.5 ppm (ortho-ortho bonded methylene groups) relative to the peak of methylene bonds appearing in the range of from 23.5 to 39.0 ppm (including ortho-ortho, para-para or ortho-para bonded methylene groups) in $^{13}$C-NMR measurement.

The peak of methylene bonds appearing in the range of from 24.8 to 32.5 ppm is specific to the ortho-ortho bonded methylene bonds between difunctional phenolic moieties.

The novolak resin of the present invention preferably has ortho-ortho bonding in a content ranging from 40 to 80% relative to all methylene bonds in the novolak resin, and a weight average molecular weight of 1,000 to 15,000.

Low molecular weight fractions of the novolak resin of the present invention should preferably be removed. The removal process of such low molecular weight fractions is not limited and preferably includes the following process: First, the novolak resin solution is dissolved in methyl amyl ketone (MAK) or a MAK-methanol mixture and the resultant solution is washed with water to remove the catalyst and unreacted compounds; the resultant solution is then mixed with a poor solvent such as hexane or heptane, or a mixture of any of these poor solvents and MAK such as a hexane-MAK mixture or a heptane-MAK mixture, stirred, and then allowed to stand to thereby separate a poor solvent layer and a MAK layer into an upper layer and a lower layer, respectively; the upper layer contains low molecular weight fractions and the lower layer contains high molecular weight fractions. Thus, a novolak resin having a high molecular weight (weight average molecular weight of 6,000 to 20,000) can be obtained by extracting the lower layer.

As described above, the novolak resin of the present invention is preferably obtained by reacting m-cresol and a novolak resin precursor formed from Bis2,5Xy and 2,6dMPC. More preferably, the novolak resin is composed of m-cresol, p-cresol and 2,5-xylenol constitutive units in mole ratios of 10–98:1–20:1–60 as measured by $^1$H-NMR. The resin can comprise 0 to 10% by mole of other phenolic constitutive units.

Next, the positive photoresist composition of the present invention comprises (A) the novolak resin obtained above and (B) a photosensitizer.

As the photosensitizer (B), quinonediazide group-containing compounds, including conventional esters of naphthoquinone-1,2-diazidesulfonic acid and polyphenolic compounds, are suitable. As the polyphenolic compounds in the present invention, polyphenolic compounds represented by the following formula (III) are practically preferred:

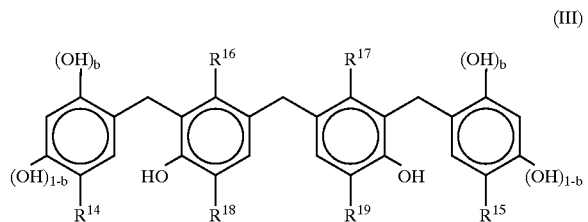

(III)

wherein each of $R^{14}$ and $R^{15}$ is H, an alkyl group, alkenyl group or alkoxy group each having from 1 to 5 carbon atoms, each of $R^{16}$ to $R^{19}$ is respectively an alkyl group or alkenyl group each having from 1 to 3 carbon atoms, and b denotes 0 or 1. The use of an ester obtained from any of the above polyphenolic compounds in combination with the novolak resin of the present invention achieves high sensitivity and definition (image resolution).

Of these polyphenolic compounds, typically preferred are bis[2,5-dimethyl-3-(4-hydroxy-5-methylbenzyl)-4-hydroxyphenyl]methane, bis[2,5-dimethyl-3-(2-hydroxy-5-methylbenzyl)-4-hydroxyphenyl]methane, and bis[2,5-dimethyl-3-(4-hydroxybenzyl)-4-hydroxyphenyl]methane.

Other polyphenolic compounds than those mentioned above can also be employed, among which preferred examples include 2,4-bis(3,5-dimethyl-4-hydroxybenzyl)-5-hydroxyphenol, 2,6-bis(2,5-dimethyl-4-hydroxybenzyl)-4-methylphenol and other linear trinuclear compounds; bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds; and other linear polyphenolic compounds.

The ester can be obtained by, for example, condensing a naphthoquinone-1,2-diazidesulfonyl halide with the polyphenolic compound for complete or partial esterification. This condensation reaction is generally advantageously conducted in an organic solvent such as dioxane, N-methylpyrrolidone or dimethylacetamide, in the presence of a basic condensing agent including triethanolamine, alkali carbonates and alkali hydrogencarbonates. As the ester of polyphenolic compound, use of an ester obtained by condensing not less than 50% by mole, preferably not less than 60% by mole of, for instance, naphthoquinone-1,2-diazide-4(or 5)-sulfonyl halide relative to the total moles of hydroxy groups in the polyphenolic compound (i.e., an ester having an esterification rate of not less than 50%, and preferably not less than 60%) is advantageous for still higher definition.

The positive photoresist composition of the invention can be incorporated with (C) a sensitizer (sense amplifier) within a range that does not adversely affecting advantageous performances of the composition.

Examples of the sensitizer include, in addition to the aforementioned polyphenolic compounds, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, 6-hydroxy-4a-(2,4-dihydroxyphenyl)-9-1'-spirocyclohexyl-1,2,3,4,4a,9a-hexahydroxanthene, 6-hydroxy-5-methyl-4a-(2,4-dihydroxy-3-methylphenyl)-9-1'-spirocyclohexyl-1,2,3,4,4a,9a-hexahydroxanthene and the like.

Of these compounds, 2,6-bis(2,5-dimethyl-4-hydroxybenzyl)-4-methylphenol, 1,4-bis[1-(3,5-dimethyl-4-hydroxyphenyl)isopropyl]benzene, and 2,4-bis[1-(4-hydroxyphenyl)isopropyl]-5-hydroxyphenol are typically suitable.

The content of Ingredient (C) should preferably fall in the range of from 5 to 50% by weight and more preferably from 10 to 35% by weight relative to the weight of the novolak resin, Ingredient (A).

In the positive photoresist composition of the present invention, Ingredient (B) should preferably be incorporated in a ratio of 10 to 60% by weight and more preferably 20 to 50% by weight relative to the total weight of the novolak resin, Ingredient (A) and Ingredient (C), which is added as desired. Use of Ingredient (B) in less than the above range fails to give an image in exact accordance with a mask pattern and deteriorates transfer properties, whereas an excess amount of Ingredient (B) deteriorates the sensitivity and homogeneity of a resultant resist film and hence decreases definition. Each of these compounds as Ingredient (B) can be used singly or in combination.

In order to enhance definition, exposure margin and the film residual rate, the following can be added to the positive photoresist composition of the invention, p-toluenesulfonyl chloride (PTSC), 4,4'-diethylaminobenzophenone, 1,4-bis[1-(2-methyl-4-hydroxy-5-cyclohexylphenyl)isopropyl]benzene and 1,3-bis [1-(2-methyl-4-hydroxy-5-cyclohexylphenyl)isopropyl]benzene, in ratios of 0.01 to 5% by weight, 0.01 to 5% by weight, 0.01 to 10% by weight and 0.01 to 10% by weight relative to the total weight of the compositions, respectively.

In addition to the above specified ingredients, where necessary, the composition of the present invention may further comprise any of compatible additives including, for example, ultraviolet absorbents for inhibiting halation and surfactants for preventing striation within ranges that do not adversely affect the objects of the invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4'-diethylaminoazobenzene and curcumin. As the surfactants, for instance, Fluorade FC-430 and FC-431 (trade names, manufactured by Sumitomo 3M Ltd., Japan), F-TOP EF122A, EF122B, EF122C and EF126 (trade names, Tochem Products Ltd., Japan) and other fluorine-containing surfactants may be mentioned.

The positive photoresist composition of the present invention may preferably be used as a solution obtained by dissolving each of the above-specified ingredients in a proper solvent. Examples of the solvent include those used in conventional positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these compounds may be used solely or in combination of these compounds, typically preferred are acetone, methyl ethyl ketone, cyclohexanone, methyl isoamyl ketone, 2-heptanone and other ketones; and ethyl lactate, methyl acetate, ethyl acetate, butyl acetate, methyl pyruvate, ethyl pyruvate, methyl methoxypropionate, ethyl ethoxypropionate and other esters.

The positive photoresist composition of the invention may be used, for example, in the following manner: the positive photoresist composition is dissolved in a solvent to give a coating solution; the coating solution is then applied onto a substrate such as a silicon wafer using a spinner and subsequently dried to form a photosensitive layer; next, the photosensitive layer is irradiated and exposed with an ultraviolet ray source such as a low-pressure mercury lamp, a high-pressure mercury lamp or an ultra-high-pressure mercury lamp through a photomask with a drawn pattern; and the exposed portions of the film are then dissolved and removed by dipping in a developer solution, for example, an alkaline aqueous solution such as a 1 to 10% by weight tetramethylammonium hydroxide (TMAH) aqueous solution, thus forming a pattern image (resist pattern) in exact accordance with the mask pattern.

The present invention will be further illustrated in detail with reference to several inventive examples and comparative examples below which are not directed to limiting the scope of the invention.

Each of the characteristics of the positive photoresist compositions was evaluated according to the following manner, respectively.

[Focal Depth Range Properties]

A sample was subjected to exposure and development using a reducing-type projection aligner NSR-2005i10D (manufactured by Nikon Corporation, Japan; NA=0.57) at an exposure of Eop (the exposure time period to form a 0.30 µm line-and-space (L&S) width of 1:1) as a standard exposure, and the focus was shifted up and down at this exposure. The obtained resist pattern was subjected to an SEM photographic observation. Based upon the SEM photograph, the focal depth range was defined as the maximum value (µm) of the focal shift (defocus) to obtain a 0.30-µm rectangular resist pattern.

[Definition]

The definition was defined as the critical definition at an exposure which reproduced a 0.50-µm mask pattern.

[Coating Performance]

A sample of a given amount was applied onto a 6-inch silicon wafer using a spinner, and the coating performance was evaluated according to the following criteria:

○: Homogeneous coating spread over the periphery of wafer

×: No homogeneous coating spread over the periphery the wafer

[Heat Resistance]

A sample having a 1.0-µm L&S resist pattern was heated and the temperature at which a corner of the resist pattern collapsed was determined. On the basis of this determination, the heat resistance was evaluated according to the following criteria:

○: Not collapsed even at 140° C.

Δ: Collapsed at 130 to 140° C.

×: Collapsed at a temperature below 130° C.

[Exposure Margin]

A sample was applied onto a silicon wafer using a spinner, and dried on a hot plate at 90° C. for 90 sec. to form a resist film having a thickness of 1.0 µm. The resist film was then irradiated for an increasing period from 0.1 sec. at intervals of 0.01 sec. using a reducing-type projection aligner NSR-2005i10D (manufactured by Nikon Corporation, Japan; NA=0.57). The film was then post-expose baked (PEB) at 110° C. for 90 sec.; subjected to development in a 2.38% by weight tetramethylammonium hydroxide aqueous solution at 23° C. for 60 sec., washed with water for 30 sec., and dried. In this procedure, the exposure margin was defined as Eop/Eth (ms), where the exposure time period to give exposed portion having a thickness of 0 after development was defined as Eth, and the exposure time period to obtain a 0.50-m L&S with a ratio of the line and space of 1:1 was defined as Eop, each of which was measured in the unit of millisecond (ms).

[Scum Evaluation]

The resist pattern after development was subjected to an SEM observation. Based upon this SEM photograph, the scum (residue after development) of the surface of pattern was evaluated in accordance with the following criteria:

○: No scum observed

×: Scum observed

[Content of Ortho-ortho Bonding]

The content of ortho-ortho bonding was determined by $^{13}$C-NMR spectrum in the following manner: Using a 400-MHz $^{13}$C-NMR spectrometer (JNM-GX400; JEOL Ltd., Japan), the spectrum was determined in a deuterated methanol employing tetramethylsilane as an internal standard. All of the methylene bonds (ortho-ortho, ortho-para and para-para bonding) appear in the range from 23.5 ppm to 39.0 ppm, among which the ortho-ortho bonding (bond between difunctional phenolic compounds) appears in the range of from 24.8 ppm to 32.5 ppm. Accordingly, the content of ortho-ortho bonding was determined by dividing the integral in the range of from 24.8 ppm to 32.5 ppm by the integral in the range of from 23.5 ppm to 39.0 ppm, and multiplying the resultant value by 100.

SYNTHESIS EXAMPLE 1

Synthesis of a Novolak Resin (Resin 1)

1-1: Synthesis of Bis2,5Xy

Bis2,5Xy was obtained in the following manner: To 540 g of water, 733.2 g (6.0 moles) of 2,5-xylenol and 60.0 g (1.5 moles) of sodium hydroxide were added; the resultant mixture was stirred and heated to 75° C., and then 162.2 g (5.4 moles) of a 37% formaldehyde aqueous solution was added dropwise over 3 hours; the mixture was then stirred for 4 hours while maintaining the temperature at 75° C., and then cooled to 50° C.; to the cooled mixture was added 172 g of a 36% hydrochloric acid solution which was then stirred for 10 minutes to thereby neutralize the reaction solution; to the resulting solution was added 2,000 g of butyl acetate, the mixture was stirred and then allowed to stand for separation, and the resultant butyl acetate layer was extracted. By distilling off butyl acetate using an evaporator, crystals of Bis2,5Xy were separated. The crystals were subjected to recrystallization using a toluene-butyl acetate mixture (8:2) to give 307.2 g of crystals of Bis2,5Xy (yield: 40%).

1-2: Synthesis of Novolak Resin Precursor

A novolak resin precursor was prepared as follows: In a γ-butyrolactone-methanol mixture (4:1), 84 g (0.5 mole) of 2,6dMPC was dissolved to give a 6.5% by weight solution (Solution A). In a similar manner, 256 g (1.0 mole) of Bis2,5Xy obtained in the above Synthesis Example 1-1 was dissolved in γ-butyrolactone to give a 30% by weight solution (Solution B).

Next, 10 g of p-toluenesulfonic acid was added as an acid catalyst to Solution B, and the resultant mixture was heated to 95° C. while stirring. To this mixture, Solution A was added dropwise over 1 hour, and after completion of the addition, the resultant mixture was stirred for 4 hours while maintaining the temperature at 95° C. to give a novolak resin precursor. Upon analysis, the obtained precursor was found to be a compound composed of plural difunctional phenolic compounds bonded through methylene bonds and to have ortho-ortho bonding in a content of 56% and a weight average molecular weight of 1,456.

1-3: Synthesis of Novolak Resin (Resin 1)

A novolak resin was obtained in the following manner: To the reaction solution containing the novolak resin precursor obtained in Synthetic Example 1-2 was added 270 g (2.5 moles) of m-cresol and the solution was then heated to 95° C. while stirring. Next, to the heated solution 200 g of a 37% formaldehyde aqueous solution was added dropwise in 30 minutes, and the resultant mixture was stirred for 5 hours with maintaining the temperature at 95° C. The reaction solution was then added with 50% by weight of water relative to the weight of the reaction solution and allowed to stand for 1 hour to thereby separate into two layers. The upper layer was removed by decantation, and a novolak resin solution was obtained. This solution was further dissolved in 2,500 g of MAK, and the resultant solution was washed with water to remove the catalyst and unreacted materials. The resultant was then prepared into 4,000 g of a 15% by weight MAK solution, and this solution was added with 3,600 g of n-heptane, stirred and allowed to stand to separate layers. By extracting the lower layer (MAK layer), a solution of high ortho-ortho bonded Novolak Resin 1 having a weight average molecular weight of 7,700 and comprising ortho-ortho bonding in a content of 53% was obtained.

Based upon the $^1$H-NMR measurement, the resin was found to comprise m-cresol, p-cresol and 2,5-xylenol units in mole ratios of about 5:1:4. The content of binuclear compounds in this resin was 0.5% as shown by GPC measurement.

SYNTHESIS EXAMPLE 2

Synthesis of Novolak Resin (Resin 2)

2-1: Synthesis of Novolak Resin Precursor

In γ-butyrolactone 128 g (0.5 mole) of Bis2,5Xy obtained in the above Synthesis Example 1-1 and 270 g (2.5 moles) of m-cresol were dissolved to prepare a 40% by weight solution (Solution C). Separately, 168 g (1.0 mole) of 2,6dMPC was dissolved in a γ-butyrolactone-methanol mixture (4:1) to give a 6.5% by weight solution (Solution D). A novolak resin precursor was prepared using Solutions C and D in a manner similar to Synthesis Example 1-2. As a result of analysis, the obtained novolak resin precursor was found to be a compound composed of plural difunctional phenolic moieties and m-cresol bonded through methylene bonds and to have an ortho-ortho bonding content of 45% and a weight average molecular weight of 757.

2-2: Synthesis of Novolak Resin (Resin 2)

A reaction was carried out in the same manner as in Synthesis Example 1-3, except that the novolak resin precursor obtained in Synthesis Example 2-1 was used and m-cresol was added in an amount of 54 g (0.5 mole) to give a solution of a high ortho-ortho bonded Novolak Resin 2 having a weight average molecular weight of 6,700 and comprising ortho-ortho bonding in a content of 40%.

As a result of $^1$H-NMR measurement, the resin contained m-cresol, p-cresol and 2,5-xylenol units in mole ratios of about 6:2:2. The content of binuclear compounds was 0.6% as shown by GPC measurement.

SYNTHESTS EXAMPLE 3

Synthesis of Novolak Resin (Resin 3)

3-1: Synthesis of Novolak Resin Precursor

A novolak resin precursor was obtained as follows: In a mixture of γ-butyrolactone and methanol (4:1), 42 g (0.25 mole) of 2,6dMPC was dissolved to give a 6.5% by weight solution (Solution E). In a similar manner, 188 g (0.5 mole) of a trinuclear compound shown by the aforementioned formula (IV) was dissolved in the same mixed solvent as above to prepare a 30% by weight solution (Solution F). Next, 10 g of p-toluenesulfonic acid as an acid catalyst was added to Solution F and the resultant mixture was heated to 95° C. with stirring. To the heated mixture Solution E was added dropwise in 1 hour and then stirred for 4 hours with maintaining the temperature of the mixture at 95° C. to give a novolak resin precursor. As a result of analysis, the obtained novolak resin precursor was found to be a compound composed of plural difunctional phenolic moieties bonded through methylene bonds and to have an ortho-ortho bonding content of 50% and a weight average molecular weight of 1,821.

3-2: Synthesis of Novolak Resin (Resin 3)

A solution of a high ortho-ortho bonded novolak resin (Resin 3) having a weight average molecular weight of 6,500 and an ortho-ortho bonding content of 48% was obtained in a manner similar to Synthesis Example 1-3, except that the novolak resin precursor obtained in Synthesis Example 3-1 was employed and m-cresol was added in an amount of 351 g (3.25 moles).

This novolak resin contained, as a result of $^1$H-NMR measurement, m-cresol, p-cresol and 2,5-xylenol units in mole ratios of about 6.5:1.5:2. The content of binuclear compounds in this resin was found to be 1.3% based upon GPC measurement.

Comparative Synthesis Example 1

Synthesis of Novolak Resin (Resin 4)

To a 300-ml three neck flask, 54.1 g (0.5 mole) of m-cresol, 10.8 g (0.1 mole) of p-cresol, 48.9 g (0.4 mole) of 2,5-xylenol, 106 g of methyl isobutyl ketone (MIBK), 21.5 g of 10% oxalic acid and 22 g of acetic acid were charged. The content was then added dropwise with 70 g of a 37% formaldehyde aqueous solution in 40 minutes while heating and stirring in an oil bath at 100° C.; and the reaction was continued for further 15 hours. The reaction mixture was then washed with water and dehydrated to give a novolak resin solution in MIBK. To this solution the equal amount of n-heptane to that of the reaction solvent was added, stirred at 60° C. for 30 minutes and then allowed to stand to separate into two layers. By extracting the lower layer, a solution of novolak resin (Resin 4) having a weight average molecular weight of 9,000 and an ortho-ortho bonding content of 20% was obtained.

By the analysis using $^1$H-NMR, the resin was found to contain m-cresol, p-cresol and 2,5-xylenol units in mole ratios of about 5:1:4.

The content of binuclear compounds was 1.6% as measured by GPC.

Comparative Synthesis Example 2

Synthesis of Novolak Resin (Resin 5)

A novolak resin was obtained as follows: A mixture of 48.9 g (0.4 mole) of 2,5-xylenol, 140 g of MIBK, 7.1 g of oxalic acid and 34 g of 90% acetic acid solution was heated to 80° C. and added dropwise with 13 g of a 37% formaldehyde aqueous solution in 30 minutes. After completion of the addition, the resultant mixture was stirred at 100° C. for 6 hours; and then added with 54.1 g (0.5 mole) of m-cresol and 10.8 g (0.1 mole) of p-cresol. The mixture was then heated to 100° C., added dropwise with 65 g of a 37% formaldehyde aqueous solution in 60 minutes, and then further stirred at 100° C. for 15 hours. The resultant reaction mixture was washed with water and then dehydrated to give a novolak resin solution in MIBK. To this solution the equal amount of n-heptane to the reaction solvent was added. After stirring the resultant mixture at 60° C. for 30 minutes, it was allowed to stand so as to separate into two layers. The lower layer was extracted to give a solution of Novolak Resin 5 having a weight average molecular weight of 8,000 and an ortho-ortho bonding content of 23%.

As shown in the results of $^1$H-NMR measurement, the resin was composed of m-cresol, p-cresol and 2,5-xylenol units in mole ratios of about 5:1:4.

The GPC measurement of the resin indicated that the resin contained 1.3% of binuclear compounds.

Comparative Synthesis Example 3

Synthesis of Novolak Resin (Resin 6)

A novolak resin was prepared synthetically in the same manner as in Comparative Synthesis Example 1, except 43.3 g (0.4 mole) of m-cresol, 43.3 g (0.4 mole) of p-cresol and 24.4 g (0.2 mole) of 2,5-xylenol were employed. As a result, a solution of Novolak Resin 6 having a weight average molecular weight of 4,000 and an ortho-ortho bonding content of 25% was obtained.

A $^1$H-NMR measurement was conducted and, as a result, the resin was found to comprise m-cresol, p-cresol and 2,5-xylenol units in mole ratios of about 4:4:2. The content of binuclear compounds was 1.5% as measured by GPC.

Comparative Synthesis Example 4

Synthesis of Novolak Resin (Resin 7)

A novolak resin (Resin 7) was obtained synthetically in the following manner: A 600-ml Parr pressure reactor was filled with 216.0 g (2.0 moles) of m-cresol, 216 g of xylene and 28.4 g (0.90 mole) of a 95% by weight paraformaldehyde. The reactor was then sealed and the homogenous contents were stirred at 300 rpm. The resultant mixture was heated up to 175° C. in 45 minutes, and then subjected to a reaction for 18 hours. The reaction solution was then cooled and transferred to a 1-liter round flask equipped with a distillator. The solution was heated to 205° C., and during this procedure, the solvent and residual m-cresol were distilled off at atmospheric pressure. One hour later the pressure was reduced gradually in 50 minutes; and the reaction system was kept in vacuo at 205° C. for further 1 hour. After cooling the reaction mixture, 143.7 g of an oligomer was isolated. Of this oligomer, 70.2 g was charged to a flask, and added with 37.8 g (0.35 mole) of p-cresol, 13.0 g (0.16 mole) of a 37% formaldehyde aqueous solution and 0.16 g of oxalic acid. The reaction mixture was heated in 45 minutes until the mixture refluxed mildly. After refluxing for 18 hours, the reaction mixture was heated gradually to a temperature of 205° C. to thereby remove the solvent and some residual monomers by distillation at atmospheric pressure. One hour later, the pressure inside the flask was reduced in 45 minutes, and in further 1 hour, the residual monomer was removed and the catalyst was degraded. The flask was then cooled to give a solution of a novolak resin (Resin 7) having a weight average molecular weight of 5,700 and an ortho-ortho bonding content of 42%.

As shown by $^1$H-NMR measurement, the resin was composed of m-cresol and p-cresol in mole ratios of about 6.5:3.5. The content of binuclear compounds was 2.0% as measured by GPC.

EXAMPLES 1 TO 3 AND COMPARATIVE EXAMPLES 1 TO 4

Positive photoresist compositions were prepared by using each of Novolak Resins 1 to 7 obtained in Synthesis Examples 1 to 3 and Comparative Synthesis Examples 1 to 4 in compounding ratios shown in the following Table 1, and they were subjected to the aforementioned evaluations. The test results are set forth in Table 3.

TABLE 1

| | |
|---|---|
| Ingredient (A): Novolak resin | 100 parts by weight |
| Ingredient (B): Ester of 1 mole of Compound (B-1) and 2 moles of 1,2-naphthoquinonediazide-5-sulfonyl chloride (NQD) | 50 parts by weight |
| Ingredient (C): Compound (C-1) | 30 parts by weight |
| Ingredient (D): Compound (D-1) | 3 parts by weight |
| Solvent: 2-Heptanone | 470 parts by weight |

In Table 1, Compound (B-1) is bis[2,5-dimethyl-3-(4-hydroxy-3-methylbenzyl)-4-hydroxyphenyl]methane, Compound (C-1) is a compound represented by the following formula:

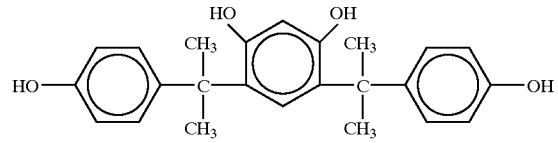

and Compound (D-1) is a compound represented by the following formula:

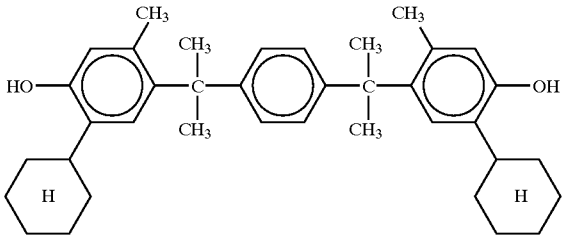

EXAMPLE 4

A positive photoresist composition was prepared in compounding ratios shown in the following Table 2 using Novolak Resin 1 obtained in Synthesis Example 1. The characteristics of the composition were evaluated as described above, and the test results are shown in Table 3.

TABLE 2

| | |
|---|---|
| Ingredient (A): Novolak resin | 100 parts by weight |
| Ingredient (B): Ester of 1 mole of Compound (B-1) and 2 moles | 50 parts by weight |

TABLE 2-continued

| | |
|---|---|
| of 1,2-naphthoquinonediazide-5-sulfonyl chloride (NQD) | |
| Ingredient (C): Compound (C-1) | 30 parts by weight |
| Ingredient (D): (1) Compound (D-1) | 3 parts by weight |
| (2) Compound (D-2) | 0.3 part by weight |
| Solvent: 2-Heptanone | 470 parts by weight |

EXAMPLE 5

A positive photoresist composition was obtained in a manner similar to Example 4, except instead of Compound (B-1), Compound (B-2) was used as Ingredient (B). The composition was subjected to the aforementioned evaluations. The test results are set forth in Table 3. Incidentally, Compound (B-2) is bis[2,5-dimethyl-3-(2-hydroxy-5-methylbenzyl)-4-hydroxyphenyl]methane.

EXAMPLE 6

The procedure of Example 4 was repeated to give a positive photoresist composition, except instead of Compound (B-1), Compound (B-3) was employed as Ingredient (B), and the characteristics of the obtained composition were evaluated in the above-mentioned manner. The test results are shown in Table 3. Compound (B-3) is bis[2,5-dimethyl-3-(4-hydroxybenzyl)-4-hydroxyphenyl]methane.

TABLE 3-1

| Example | Ingredient A (m-/p-/2,5-ratio)* (ortho-ortho content) (weight average molecular weight) | Ingredient (B) | Ingredient (D) | Focal depth range | Definition | Coating performance | Heat resistance | Exposure margin | Scum evaluation |
|---|---|---|---|---|---|---|---|---|---|
| 1 | Resin 1 (5/1/4) (53%) (7700) | B-1 | D-1 | 0.8 | 0.28 | ○ | ○ | 2.2 | ○ |
| 2 | Resin 2 (6/2/2) (40%) (6700) | B-1 | D-1 | 0.7 | 0.30 | ○ | ○ | 2.1 | ○ |
| 3 | Resin 3 (6.5/1.5/2) (48%) (6500) | B-1 | D-1 | 0.7 | 0.30 | ○ | ○ | 2.1 | ○ |
| 4 | Resin 1 (5/1/4) (53%) (7700) | B-1 | D-1 D-2 | 1.0 | 0.28 | ○ | ○ | 2.3 | ○ |

TABLE 3-2

| Example | Ingredient A (m-/p-/2,5-ratio)* (ortho-ortho content) (weight average molecular weight) | Ingredient (B) | Ingredient (D) | Focal depth range | Definition | Coating performance | Heat resistance | Exposure margin | Scum evaluation |
|---|---|---|---|---|---|---|---|---|---|
| 5 | Resin 1 (5/1/4) (53%) (7700) | B-2 | D-1 D-2 | 1.3 | 0.25 | ○ | ○ | 2.3 | ○ |
| 6 | Resin 1 (5/1/4) (53%) (7700) | B-3 | D-1 D-2 | 1.0 | 0.28 | ○ | ○ | 2.1 | ○ |

TABLE 3-1

| Comparative Example | Ingredient A (m-/p-/2,5-ratio)* (ortho-ortho content) (weight average molecular weight) | Ingredient (B) | Ingredient (D) | Focal depth range | Definition | Coating performance | Heat resistance | Exposure margin | Scum evaluation |
|---|---|---|---|---|---|---|---|---|---|
| 1 | Resin 4 (5/1/4) (20%) (9000) | B-1 | D-1 | 0.6 | 0.35 | ○ | ○ | 1.9 | ○ |

TABLE 3-1-continued

| Comparative Example | Ingredient A (m-/p-/2,5-ratio)* (ortho-ortho content) (weight average molecular weight) | Ingredient (B) | Ingredient (D) | Focal depth range | Definition | Coating performance | Heat resistance | Exposure margin | Scum evaluation |
|---|---|---|---|---|---|---|---|---|---|
| 2 | Resin 5 (5/1/4) (23%) (8000) | B-1 | D-1 | 0.7 | 0.35 | ○ | ○ | 1.8 | ○ |
| 3 | Resin 6 (4/4/2) (25%) (4000) | B-1 | D-1 | 0.5 | 0.30 | x | x | 2.0 | x |
| 4 | Resin 7 (6.5/3.5/0) (42%) (5700) | B-1 | D-1 | 0.7 | 0.30 | x | Δ | 2.2 | x |

Note)
*"m-/p-/2.5" means "m-cresol/p-cresol/2.5-xylenol."

Further, the peaks of ortho-ortho bonding in the novolak resins obtained in Comparative Synthesis Examples 1 to 4 shifted to a range of 23.5–32 ppm. This peak shift seems to be attributable to ortho-ortho bonding formed between trifunctional phenolic moieties such as m-cresol.

In contrast, each of the peaks of ortho-ortho bonding in the novolak resins obtained in Synthetic Examples 1 to 3 appeared in a range of 24.8 to 32.5 ppm, suggesting that these peaks can be attributed to ortho-ortho bonding formed between difunctional phenolic moieties, that is, Bis2,5Xy and 2,6dMPC. The results shown in Table 3 indicate that the positive photoresist compositions of the present invention, using the novolak resins comprising a large quantity of ortho-ortho bonding appearing in the range of 24.8 to 32.5 ppm, are excellent in terms of focal depth range, definition and other characteristics.

As described above, various embodiments of the present invention provide a novel novolak resin for obtaining a positive photoresist composition which contains less binuclear compounds, suppresses scum formation, is excellent in terms of definition and coating performance, and can give a resist pattern having satisfactory heat resistance. They also provide precursors for the novolak resin, methods of manufacturing these resins and precursors, and a positive photoresist composition comprising the novolak resin.

While the invention has been described in detail and with reference to specific embodiments thereof, it will be apparent one of ordinary skill in the art that various changes and modifications can be made therein without departing from the spirit and scope thereof.

What is claimed is:

1. A process of producing a novolak resin comprising the step of condensing a novolak resin precursor and a trifunctional phenolic compound in the presence of an aldehyde or a ketone, wherein in said trifunctional phenolic compound, all of the o- and p-positions relative to the hydroxy group are hydrogen atoms;

wherein said novolak resin precursor has a weight average molecular weight of 300 to 10,000, obtained by reacting at least one compound shown by the following formula (I):

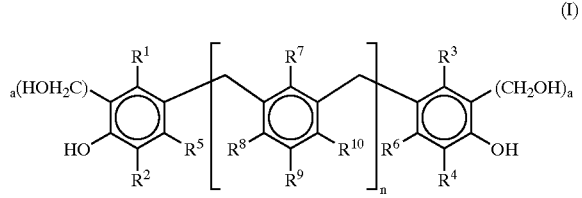

(I)

wherein each of $R^1$ and $R^3$ may be independently H, an alkyl group or alkenyl group each having from 1 to 3 carbon atoms; each of $R^2$ and $R^4$ is respectively an alkyl group or alkenyl group each having from 1 to 3 carbon atoms; each of $R^5$ and $R^6$ may be independently H, an alkyl group or alkenyl group each having from 1 to 3 carbon atoms; each of $R^7$, $R^8$, $R^9$ and $R^{10}$ may be independently H, OH, an alkyl group or alkenyl group each having from 1 to 3 carbon atoms, provided that when any one of $R^7$, $R^8$ or $R^{10}$ is OH, $R^9$ is not H, and when $R^9$ is OH, none of $R^7$, $R^8$ or $R^{10}$ is H; n denotes an integer from 0 to 3; and the letter "a" denotes 0 or 1, with at least one compound shown by the following formula (II):

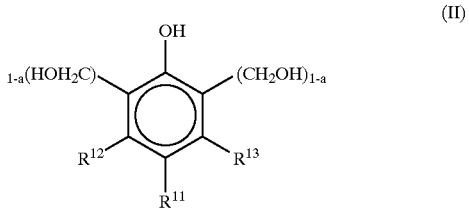

(II)

wherein $R^{11}$ is an alkyl or alkenyl group each having from 1 to 3 carbon atoms, each of $R^{12}$ and $R^{13}$ may be independently H, an alkyl group or alkenyl group each having from 1 to 3 carbon atoms; and the letter "a" denotes 0 or 1.

* * * * *